United States Patent [19]

O'Donnell

[11] Patent Number: 4,609,872
[45] Date of Patent: Sep. 2, 1986

[54] NMR MULTIPLE-ECHO PHASE-CONTRAST BLOOD FLOW IMAGING

[75] Inventor: Matthew O'Donnell, Schenectady, N.Y.

[73] Assignee: General Electric Company, Schenectady, N.Y.

[21] Appl. No.: 639,567

[22] Filed: Aug. 10, 1984

[51] Int. Cl.⁴ .............................. G01R 33/20
[52] U.S. Cl. ...................... 324/306; 324/309
[58] Field of Search ............... 324/306, 307, 309, 312; 128/653; 364/413

[56] References Cited

U.S. PATENT DOCUMENTS 4,574,239  3/1986  Singer ................................ 324/309

OTHER PUBLICATIONS

Singer, J. R., "NMR Diffusion and Flow Measurements and an Introduction to Spin Phase Graphing", *J. of Physics E: Scientific Instruments*, vol. 11, 1978, pp. 281-291.

*Primary Examiner*—Stewart J. Levy
*Assistant Examiner*—Kevin D. O'Shea
*Attorney, Agent, or Firm*—Geoffrey H. Krauss; James C. Davis, Jr.; Marvin Snyder

[57] ABSTRACT

A method for magnetic resonance imaging of fluid flow, and particularly in vivo blood flow, uses multiple-echo phase-contrast sequences of signals both in the magnetic field gradient in the direction in which fluid flow is to be determined, and in the radio-frequency (RF) magnetic field utilized with the magnetic field gradient. The magnetic field gradient has a pair of phase-encoding pulses having a zero mean value effect upon the sample, either alone or with inversion by an intermediate 180° RF pulse signal. A first multi-echo sequence, provided with the phase-encoding pulse pair, provides information of both the amplitude and phase-shift of each pixel of the imaged flowing material while a second multiple echo sequence, devoid of the phase-encoding-gradient pulses, provides information as to the amplitude and the undesired initial phase-shift of each pixel of both stationary and flowing material. Information provided responsive to the second sequence is subtracted from the information provided responsive to the first sequence to provide an image having an intermediate grey-scale value for stationary sample material and with differential grey-scale encoding for differential flow velocities of fluid passing through the image plane.

21 Claims, 15 Drawing Figures

NMR MULTIPLE-ECHO PHASE-CONTRAST BLOOD FLOW IMAGING

BACKGROUND OF THE INVENTION

The present invention relates to the imaging of liquids flowing in heterogeneous objects using nuclear magnetic resonance (NMR) methods and, more particularly, to in vivo blood flow imaging wherein image contrast enhancement is achieved by exploiting blood flow rate to discriminate against the stationary media surrounding the blood flow network. In particular, novel methods are disclosed for producing a plan view image of blood flow in portions of the human body by providing two-dimensional phase-contrast images differentiating between a substantially-stationary body portion and a fluid flow velocity, or rate.

NMR imaging offers significant advantages as a medical diagnostic tool, the most important of which are (a) the completely non-invasive nature of the technology and (b) the ability to spatially encode the NMR signal data with a good degree of precision using field gradients. The term "Zeugmatography" has been coined recently to cover an increasing range of NMR techniques wherein static magnetic fields (to produce the polarization of nuclei) are combined with field gradients (to spatially encode the volume of interest) and with RF fields (to spatially reorient polarized nuclei) to achieve a wide range of objectives, including imaging. In the recent past, the technical and patent literature have burgeoned and have reported results of successive advances in the field. While the field has progressed steadily, certain intrinsic drawbacks have heretofore limited certain uses of NMR high resolution imaging in medicine. Chief among these are the comparatively slow nuclear spin relaxation times of human tissue, and body motion due both to inherent movements within the body and the difficulty of keeping the body stationary for long periods of time. Human tissue is known to have a spin-lattice relaxation time, $T_1$, of approximately 0.5 seconds and a spin-spin relaxation time, $T_2$, of approximately 0.05 seconds. Both of these time constants are very slow as compared to the speed of the instrumentation available to process NMR signals. Also, high resolution imaging requires a large number of pixel projections, each of which may be the result of a complete NMR pulse sequence, where each NMR sequence is at least influenced, if not limited, by these time constants. Therefore, real time (or even near-real time) imaging of body tissue has been of somewhat limited resolution, or contrast, and two-dimensional plan view maps of moving elements such as blood have heretofore only been discussed. High contrast two-dimensional imaging of in vivo blood flow in real time has been beyond the reach of NMR technologies.

Over the years, NMR has been used to measure flow, including flow rates in a variety of fluids as well as blood flow, but not in an imaging context. An early approach to using NMR in general for measuring fluid flow (actually liquid flow) is provided in U.S. Pat. No. 3,191,119 to Singer. This patent discloses the measurement of flow rates basically by measuring the amount of absorption energy needed to restore a transported volume of polarized liquid at a downstream location in a conduit, to the amount of polarization which was induced in an upstream location. While the disclosure recites applicability of the scheme to blood flow, it is clear that the apparatus is not conveniently adaptable to in vivo measurement. The Singer patent is illustrative of a fair-sized body of prior art using similar NMR techniques to measure liquid flow generally confined within conduits, around which instrumentation is placed. Recent patents of this genre are U.S. Pat. No. 4,259,638 to Krueger et al. and U.S. Pat. No. 4,110,680 to Bergmann et al.

Various methods for in vivo flow-encoding using pulsed-gradient NMR have been proposed, but most of these methods are sensitive only to a limited range of flow velocities. An application Ser. No. 490,605, entitled "NMR Blood Flow Imaging", utilizing an in vivo technique for discriminating against stationary tissue, was filed on May 2, 1983, assigned to the assignee of the present application and is incorporated herein in its entirety by reference. U.S. Pat. Nos. 4,431,968 and 4,443,760, even though not concerned with flow imaging, are both assigned to the assignee of the present application and are each incorporated herein in their entireties by reference, especially as to their teachings of NMR imaging systems and basic techniques.

Producing blood flow images of various sorts also may be found in the patent literature, but these make extensive use of acoustic or other forms of energy. U.S. Pat. No. 4,205,687 to White et al. discloses the production of a color-coded television or CRT type display of a portion of a blood vessel obtained using a mechanically articulated transducer to cover the area of interest on the patient. This approach uses basic Doppler processing and produces a velocity/color CRT image. U.S. Pat. No. 4,182,173 to Papadofrangakis et al. and assigned to the instant assignee, also discloses a sonic Doppler technique for imaging portions of the body including blood vessels, and produces a real time measurement of flow velocity in selected regions of the patient. A B-scan CRT display is provided on which cross-sectional view data is presented.

A method of measuring in vivo blood flow using hard radiation is described in U.S. Pat. No. 4,037,585 to Gildenberg. The disclosure recites the use of X or gamma ray scanning of the cranium in successive layers or slices by a narrow beam, and the subsequent digital processing of the resultant signals to build a visual presentation of the slice under examination. Additional non-invasive blood flow measuring techniques are taught in U.S. Pat. No. 3,809,070 to Doll et al., and in U.S. Pat. No. 4,334,543 to Fehr.

Despite the significant amount of effort directed toward the tasks of imaging human tissue in general, and in particular to the imaging of blood, it remains highly desirable to provide a non-invasive, in vivo, real time, high contrast NMR fluid-flow imaging method, and especially a method which would allow a single data set to substantially-simultaneously generate conventional T₁-weighted images, T₂ images and blood-flow images.

BRIEF SUMMARY OF THE INVENTION

In accordance with the invention, a method for magnetic resonance imaging of fluid flow, and particularly in vivo blood flow, uses multiple-echo phase-contrast sequences of signals both in the magnetic field gradient in the direction in which fluid flow is to be determined, and in the radio-frequency (RF) magnetic field utilized with the magnetic field gradient to evoke an imaging response signal from the sample to be imaged. In particular, the magnetic field gradient is provided with a pair of phase-encoding pulses having a zero mean value effect upon the sample, either alone or with inversion by an intermediate 180° RF pulse signal. Each echo-providing excitation, in a first multi-echo sequence, is provided with the phase-encoding pulse pair, which may be of alternating nature if alternating echo response signals are to be evoked. The first multi-echo sequence provides information which, upon processing (as by FFT techniques and the like), has information of both the amplitude and phase-shift of each pixel of the imaged flowing material, plus undesired phase-shift of stationary material. The sample is then subjected to a second multiple echo sequence, which is devoid of the phase-encoding-gradient pulses, but otherwise substantially similar to the first sequence, to provide information as to the amplitude and the undesired inherent phase-shift of each pixel of imaged material, both stationary and flowing. The information provided responsive to the second sequence is subtracted from the information provided responsive to the first sequence, to remove the inherent phase-shift information of all of the imaged material, whereby an image is obtained having enhanced contrast values for only the flowing material. An image having an intermediate grey-scale value for stationary sample material can thus be provided, responsive to sample T1 or T2 data, with differential grey-scale coding for differential flow velocities of fluid passing through the image plane.

In one presently preferred embodiment, the differential phase-contrast information is used to provide respective increasing grey-scale (lighter) and decreasing grey-scale (darker) values in each pixel corresponding to fluid moving respectively parallel and anti-parallel to the flow axis established by the magnetic field gradient(s) having the flow-encoding pluses therein.

Accordingly, it is an object of the present invention to provide a novel method for providing a fluid flow image utilizing multiple-echo, phase-contrast magnetic resonance signals.

This and other objects of the present invention will become apparent upon reading of the following detailed description of the invention, when considered in conjunction with the drawings.

BRIEF DESCRIPTION OF THE DRAWINGS

FIGS. 3a' and 3d' are additional signal waveform sequences, replacing the sequences of FIGS. 3a and 3d, respectively, for a second presently preferred method for multiple-echo, phase-contrast NMR blood flow imaging;

DETAILED DESCRIPTION OF THE INVENTION

Figure 1:
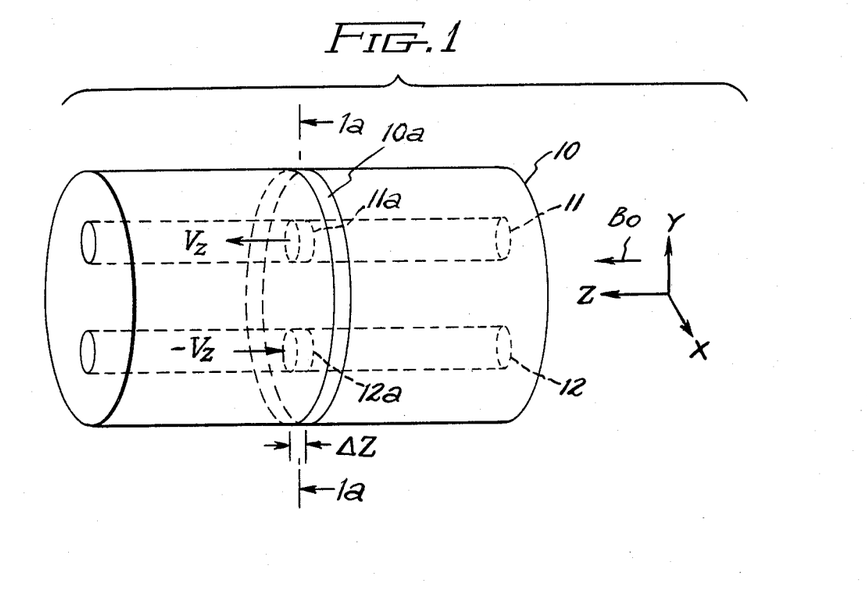
FIG. 1 illustrates an NMR imaging sample positioned in a static magnetic field and having a thin planar slab defined therein, through which planar slab fluid flow in either direction is to be imaged.
Figure 1A:
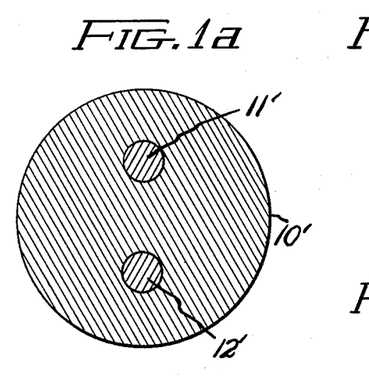
FIG. 1a is an illustration of the desired gray-scale image of the slab, taken along sectional lines 1a—1a of FIG. 1.

Referring initially to FIGS. 1 and 1a, a sample 10, shown of cylindrical shape for simplicity, has at least one channel therein through which a liquid flows at an unknown velocity, i.e. as a vector quantity having both magnitude and direction. Illustratively, sample 10 has a pair of channels 11 and 12, in which fluid flows in opposite directions. It is desired to obtain information as to the velocity of fluid flow at the location of a particular planar slab 10a of the sample. Advantageously, the fluid flow information should be obtained in a form capable of visual presentation, for rapid interpretation. That is, the fluid volume 11a flowing in a first channel 11 passing through planar sample slab 10a is to be presented as a first gray-scale region 11' (FIG. 1a) and the fluid volume 12a flowing in the other channel 12, through planar slab 10a, is to be presented as a second gray-scale image portion 12', each having a gray-scale value proportional to the magnitude $|V_Z|$ of the fluid flow velocity $V_Z$ and different from a gray-scale value assigned to a gray-scale representation 10' of the stationary portion of slab 10a. Further, it is desired that flow image portions 11' and 12' have different gray-scale values indicative of the direction of fluid flow, i.e. that a flow, as of volume 11a in a first direction, e.g. in the direction of the Z axis of a Cartesian coordinate system established with its Z axis along the elongated axis of the sample 10 (and along which Z axis is impressed a static magnetic field of magnitude $B_O$), has a different gray-scale value than the value assigned to the flow of the other volume 12a in an opposite direction, i.e. in the −Z direction. This may be accomplished, for example, by presenting the stationary portions 10' as a medium-grey image portion and presenting the regions 11' and 12' with respective lighter or darker grey-scale density responsive to flow in one or the other direction (e.g. parallel or antiparallel to the desired direction), respectively, and with the grey-scale density difference from the medium-grey scale density (of the stationary portion) being equal, but opposite, for equal $|V_Z|$ in the two different directions.

Previously, most of the NMR methods proposed for utilizing imaging pulse sequences to generate quantitative blood flow images have sought to selectively irradiate, and thus "tag", protons so that the pixel brightness in the resulting NMR image is related to the velocity of the flowing protons. Such methods all, in essence, utilize the signal amplitude to measure the replacement of saturated or partially-saturated protons by unsaturated protons. Although conceptually simple, these methods encounter difficulties, as there are many factors besides flow velocity that can influence the pixel brightness in a conventional NMR image. In fact, it has been noted that the signal amplitude in a flowing region is substantially linked to the particular pulse sequence utilized for imaging. An alternative method for measuring fluid flow utilizing nuclear magnetic resonance requires the monitoring of the phase of the NMR response signal, after application of pulse gradients. The pulse gradients are typically chosen such that the phase of stationary objects is not changed, while the phase of moving objects in altered in simple proportion to the velocity. This method, first proposed by Hahn in 1960 to detect the motion of seawater, has caused several attempts, in recent years, to incorporate a flow-encoding pulse sequence into conventional NMR imaging sequences to produce fluid flow images. These flow-encoding schemes have hitherto suffered from two problems: the phase in an NMR image varies throughout the image plane for a number of reasons, so that the phase image, following a flow-encoding pulse, is not related solely to the velocity of the flowing fluid; and the range of flow velocities detectable with these methods, given the inherent signal-to-noise limitations of an NMR image, have been relatively limited.

Figure 2A:
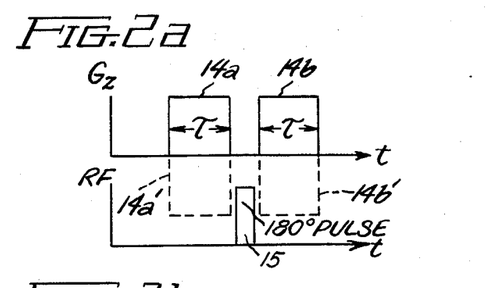
FIGS. 2a and 2b are illustrations of two different phase-encoding sequences utilizable in the methods of the present invention.
Figure 2B:
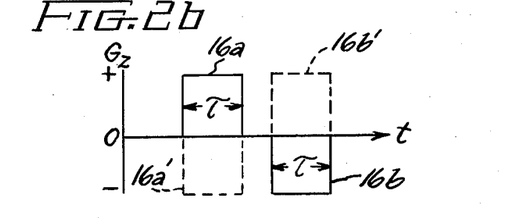

Referring to FIGS. 2a and 2b, in the presence of a balanced magnetic field gradient, i.e. a magnetic field gradient pulse having a zero mean over a finite time, the phase of the nuclear magnetization of the flowing fluid is shifted in proportion to both the flow velocity V and the magnetic field gradient magnitude G, in the direction of fluid flow. That is, a fluid flow in the Z direction imparts a phase shift proportion to the $G_Z$ gradient and the fluid velocity $V_Z$ along the Z-axis. The balanced gradient sequence of FIG. 2a utilizes a pair of Z-axis gradient $G_Z$ pulses 14a and 14b of substantially identical duration $\tau$, with a 180° radio-frequency (RF) pulse 15 applied therebetween; the RF magnetic field corresponding to pulse 15 is applied in the X-Y plane, and serves to invert the phase rotation produced by the second gradient pulse 14b. Both pulses 14 are of the same polarity, which can be positive (as shown by pulses 14a and 14b) or negative (as shown by pulses 14a' and 14b'). The equivalent zero-mean balanced gradient can also be applied, without the use of an RF magnetic field, by utilizing the bi-polarity $G_Z$ pulse sequence of FIG. 2b, wherein the polarity of two sequential pulses, of substantially identical duration $\tau$, are of opposite polarity; thus, a first pulse 16a, of positive polarity, is balanced by a second, negative-polarity pulse 16b (or a first negative-polarity pulse 16a' is balanced by a second, positive-polarity pulse 16b'). Each of the pulse sequences in FIG. 2a or FIG. 2b shifts the phase of an NMR response signal from a flowing fluid by a like amount, if the magnitude and direction of the pulses are substantially identical. The phase rotation introduced by any gradient sequence, having a zero mean over finite time, is represented by $\phi$;

$$\phi = \int_0^\tau \gamma G_Z(t) V_Z(t) dt \tag{1}$$

where $\gamma$ is the gyromagnetic ratio for the nuclei under investigation, $\tau$ is the duration of the gradient pulse and the time-dependent gradient pulse G(t) is applied along that axis, e.g. Z axis, along which the velocity V(t), e.g. velocity $V_Z(t)$, is to be measured. For either of the pulse sequences shown in FIG. 2a or 2b, the phase shift equation (1) becomes:

$$\phi = \gamma G_Z \left[ - \int_0^\tau V_Z(t) dt + \int_\tau^{2\tau} V_Z(t) dt \right]. \tag{2}$$

It will be seen that, for stationary nuclei, the phase shift given by the above equation ideally reduces to zero and there is thus no net phase rotation. However, the movement of fluid nuclei in the Z direction with a uniform velocity V, over the duration of the gradient pulse, causes a phase rotation given by:

$$\phi = \gamma G_Z V_Z [-\tau^2/2 + 2\tau^2 - \tau^2/2] = \gamma G_Z V_Z \tau^2. \tag{3}$$

That is, the phase of uniformly-flowing nuclei is rotated independent of position and in proportion only to the flow velocity ($V_Z$), the magnitude ($G_Z$) of the applied magnetic field gradient, and the square of the duration ($\tau$) of each lobe of the flow-encoding pulses 14 or 16. It will also be seen that the sign of the phase change is determined by the direction of the flow relative to the gradient direction, so that, for a dual-lobe flow-encoding pulse sequence having a positive-polarity for first pulse (14a or 16a), flow in the direction of the gradient field generates a phase advance, whereas flow antiparallel to the direction of the gradient field generates a phase retardation. These sequences are known and have, in fact, been proposed by P. R. Moran, in "A Flow Velocity Zeugmatographic Interlace for NMR Imaging in Humans", Magnetic Resonance Imaging, V. 1, pages 197–203 (1982); Moran's proposal was for incorporation of a flow-encoding pulse into an imaging sequence just prior to the onset of the read-out gradient and with the resulting spin-echo signal utilized for conventional imaging. Moran proposed to sweep the magnitude of the flow-encoding pulse over a range of values spaced evenly between some maximum and minimum amplitudes and to use such a gradient sequence to encode the spins for flow velocity in analogy to the phase-encoding utilized for spatial location in spin-warp imaging. The method of Moran requires that a complete two-dimensional (2-D) or three-dimensional (3-D) imaging sequence be completed and an image be generated, utilizing conventional reconstruction methods, for each value of the magnitude of the flow-encoding pulse. Thus, Moran requires N independent 2-D or 3-D images to be obtained, corresponding to the N independent values of the flow-encoding pulse, and with this set of N independent images being then Fourier transformed with respect to the flow-encoding sequence on a pixel-by-pixel basis to generate a set of N flow images. Each image of this set displays all pixels within the object moving at a particular flow velocity, where the pixel brightness is determined by either the spin-density or the relaxation times in that pixel. This approach requires an inordinately long time to generate very crude velocity maps and is thus not practical for most clinical applications. For example, if 1 minute is required to acquire all data necessary for reconstruction of a convention 2-D image of 128×128 pixels, then the use of Moran's method would require 10 minutes to acquire all the data needed to generate velocity images with a velocity resolution of 1 cm/sec. over a velocity range of ±5 cm/sec. This is a relatively long acquisition time for such relatively poor velocity resolution; further, if both the absolute magnitude and the direction of flow are required, rather than just the component or flow along a particular axis, then independent flow-encoding sequences must be applied along each axis and, for the example presented above, would result in an acquisition time of 30 minutes, which obviously renders the technique impractical for most clinical applications.

My novel method for imaging fluid flow utilizes a multi-echo, phase-contrast imaging sequence with flow-encoding by at least one pulsed gradient field. In broad terms, a fixed flow-encoding pulse is switched on and off at each value of an imaging gradient. In the illustrative sequences to be described in detail hereinafter, the flow-encoding pulse sequence is applied to one of a pair of sequential, modified spin-warp imaging sequences. In the absence of the flow-encoding pulse, a first (convention) image is formed, where the reconstruction Fourier transforms provide the spin-echo data in a plurality, e.g. two or three, of dimensions to provide the complex value $A_1(X,Y,Z)$ of a pixel, at location $(X,Y,Z)$, with a spin density $\rho'(X,Y,Z)$ as may be modified by the appropriate relaxation time, and with a phase factor $\phi(X,Y,Z)$ which may vary throughout the imaging plane. That is, $$A_1(X,Y,Z) = \rho'(X,Y,Z)\exp(i\phi(X,Y,Z)). \tag{4}$$

The phase term $\phi(X,Y,Z)$ can, for many reasons, be a non-zero term, even in the absence of the flow-encoding pulse sequence. For example, if the RF magnetic field utilized to excite the nuclear spins generates eddy currents within the sample being imaged, then the phase of the exciting RF field may vary throughout the imaged plane. Typically, only the modulus of A, i.e. $|A| = |A(X,Y,Z)|$, is usually displayed to overcome the effects of phase variations throughout the imaged plane and provide an unambiguous representation of the spin density $\rho'(X,Y,Z)$. However, in accordance with one principle of my present method, even during the spin-warp imaging sequence which is devoid of a flow-encoding pulse sequence, the entire set of complex pixel values $A_1(X,Y,Z)$ is retained. The flow-encoding pulse is applied, during the one of a pair of modified spin-warp imaging sequences, after the phase-encoding pulse and immediately prior to the response signal read-out gradient. The same flow-encoding pulse pair is utilized throughout the entire flow-encoded imaging sequence such that the spin-echo data for a second image represents the spatial Fourier transform of the density function $\rho'(X,Y,Z)$ modulated in phase by the magnitude of flow within each pixel, as well as by the phase term $\phi(X,Y,Z)$. Thus, if a flow-encoding pulse of magnitude G and duration $\tau$ is applied along the Z axis, the reconstructed complex value at each pixel of the flow-encoded second image is $$A_2(X,Y,Z) = \rho'(X,Y,Z)\exp(i\gamma G V_Z(X,Y,Z)\tau^2)\exp(i\phi(X,Y,Z)). \tag{5}$$

In the foregoing equation, $V_Z(X,Y,Z)$ is the component of the fluid flow velocity along the Z axis at position $(X,Y,Z)$. It will be seen that the only difference between the pair of images formed in accordance with equations 4 and 5 is that the phase in each pixel of the second image (formed in accordance with equation 5) is rotated with respect to the phase of the first image (formed in accordance with equation 4) and is rotated in proportion to the flow velocity in each pixel. In pixels where there is no flow, the two images are identical. Consequently, the phase difference between $A_2(X,Y,Z)$ and $A_1(X,Y,Z)$ generates an image that is directly related to the flow velocity in each pixel. This phase contrast image can be computed utilizing the expression $$\Delta\phi(X,Y,Z) = \tan^{-1}\frac{(I_2 \cdot R_1 - R_2 \cdot I_1)}{(R_1 \cdot R_2 + I_1 \cdot I_2)}, \tag{6}$$

where $R_1 = \text{Re}(A_1(X,Y,Z))$, $R_2 = \text{Re}(A_2(X,Y,Z))$, $I_1 = \text{Im}(A_1(X,Y,Z))$ and $I_2 = \text{Im}(A_2(X,Y,Z))$. Thus, the differential phase contrast value at each phase-contrast image pixel is related to the flow velocity $V_Z$, at that pixel, by the expression $$\Delta\phi(X,Y,Z) = \gamma G V_Z(X,Y,Z)\tau^2. \tag{7}$$

Therefore, a flow image is obtainable from the phase contrast image by inverting the previous equation to yield the velocity, at a particular pixel and in the direction of the gradient, by $$V_Z(X,Y,Z) = \Delta\phi(X,Y,Z)/(\gamma G \tau^2). \tag{8}$$

It will be seen that the use of phase contrast greatly reduces the data acquisition time for quantitative flow imaging since only one additional repetition of the entire imaging sequence is needed to obtain flow information. Thus, if a conventional imaging sequence requires 1 minute to complete, then only 2 minutes are needed to acquire all the data necessary for reconstruction of a flow velocity image along a particular axis. Similarly, a complete reconstruction of both magnitude and direction of fluid flow requires only 4 minutes, for a basic 1-minute imaging sequence.

Figures 3A, 3B:
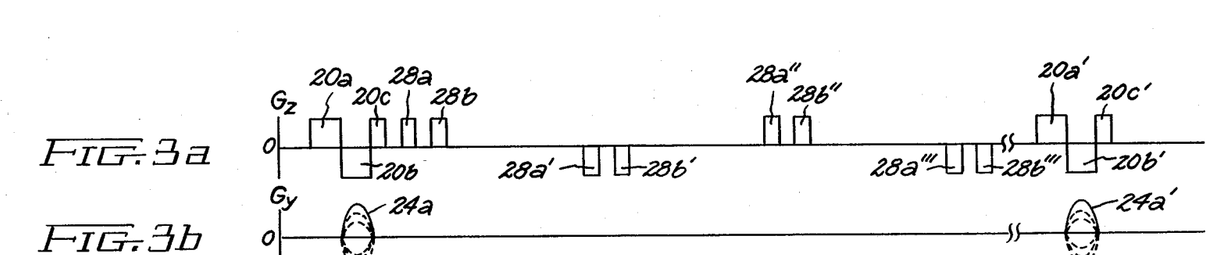
FIGS. 3a–3e are a set of time-coordinated signal waveforms illustrating a first presently preferred embodiment of the multiple-echo, phase-encoding NMR imaging method of the present invention.
Figures 3A, 3D, 3E:
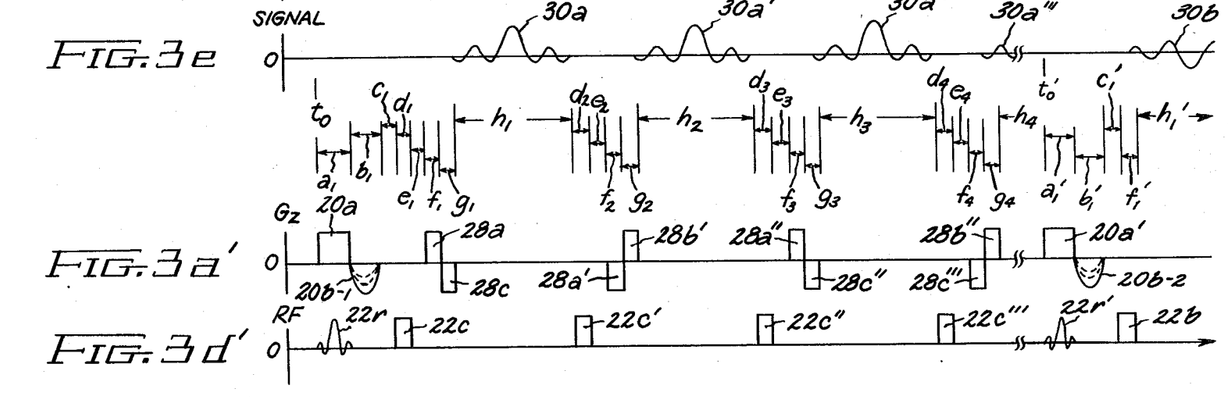
Figures 3C, 3D:
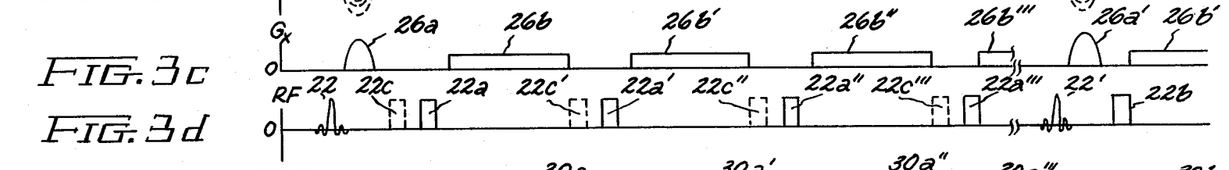

Referring now to FIGS. 3a–3e, the three Cartesian magnetic field gradients ($G_X$, $G_Y$ and $G_Z$) and the RF excitation signal are respectively graphed in FIGS. 3a–3d, in addition to the received NMR response imaging signal graphed in FIG. 3e, for one possible two-dimensional flow image sequence. Starting at a sequence initial time $t_0$, a slab-selection $G_Z$ gradient pulse lobe 20a, of positive-polarity, is provided. During pulse 20a, an RF selective 90° pulse signal 22, illustratively amplitude-modulated with a (sine bt)/bt, where b is a constant and t is time, envelope is utilized to confine the selective excitation to the nuclei in the slab 10a (FIG. 1); the amplitude of pulse 20a selects the Z-axis position of slab 10a, while the frequency components of RF pulse 22 select the thickness $\Delta Z$, about the central Z-axis location, of the slab. At the end of the Z-axis slab-definition time interval $a_1$, the RF pulse signal 22 has terminated and gradients are applied in all three Cartesian directions; during second time interval $b_1$, the Z-axis gradient field $G_Z$ is applied with an opposite-polarity (negative-polarity) lobe 20b acting to rephase the spins across the $\Delta Z$ slab 10a, while the Y-axis gradient field $G_Y$ is provided with a pulse 24a with a magnitude and polarity selecting one of a number of parallel columns of nuclei to be imaged by the present sequence, and the X-axis gradient field $G_X$ is supplied with a lobe 26 acting to dephase spins in the X-axis direction, such that later applications of a $G_X$ gradient field will rephase the nuclei spins and provide a subsequent spin-echo imaging response signal 30. The gradient pulses 20b, 24a and 26a terminate at the end of time interval $b_1$. In the next time interval $c_1$, in accordance with one principle of the present invention, an additional lobe 20c is utilized in the gradient (e.g. gradient Z) of the direction (e.g. the Z-axis) along which flow (e.g. $|V_Z|$) is to be imaged. Pulse lobe 20c has the same polarity as the original slab-selection pulse lobe 20a, and is of an amplitude and duration selected to normalize the spins of nuclei within the slab 10a to be imaged, such that the same amount of phase shift is imparted to flowing nuclei and stationary nuclei in that slab with no flow-encoding excitation.

At the termination of time interval $c_1$, the multiple-echo imaging sequence itself commences. A short time interval $d_1$ is provided to assure that all gradients have returned to a substantially zero value. In the next time interval $e_1$, the first of a pair of phase-encoding gradient pulses 28a and 28b is provided in the gradient magnetic field along the axis in which flow-encoding is to be investigated, e.g. $G_Z$ pulse 28a is provided in gradient field $G_Z$ for imaging along the Z axis. Pulse 28a is analogous to pulse 14a in FIG. 2a. At the end of time interval $e_1$ (having a duration equal to the duration $\tau$ of pulse 14a of FIG. 2a), pulse 28a terminates and a 180° non-selective inverting RF signal pulse 22a is provided during time interval $f_1$; pulse 22a is analagous to pulse 15 of the sequence in FIG. 2a. In next subsequent time interval $g_1$, a second, similar-polarity gradient field pulse 28b is provided in the $G_Z$ field, analogous to pulse 14b in FIG. 2a. Thus, because of the inverting pulse 22a, the flow-encoding pulse pair 28a and 28b have a zero net mean, but impart a flow-encoding phase shift to the spins of flowing nuclei. At the end of time interval $g_1$, the flow-encoding pulse pair 28a and 28b are completed, and a read-out X-axis gradient $G_X$ portion 26b-1 is applied, to cause a first spin-echo imaging response signal 30a, of a plurality N thereof, to appear during response interval $h_1$. It will be seen that, while the X-gradient field dephasing lobe 26a is often of a polarity opposite to the read-out gradient portion 26b, lobe 26a in the present sequence, due to the presence of a 180° non-selective inversion RF pulse 22a, is inverted to have the same polarity as the initial dephasing $G_X$ pulse 26a and is of the same positive polarity as subsequent read-out pulses 26b, 26b', 26b'', 26b''', etc.

Advantageously, each phase-encoded X-direction column of the slab is caused to provide the plurality N of successive spin-echo response signals 30, to facilitate response signal averaging and increase the signal-to-noise ratio, as well as to provide information for $T_1$ and $T_2$ imaging. Therefore, subsequent-echo preparatory time intervals $d_2$, $d_3$, $d_4$, . . . are provided before a first flow-encoding pulse 28a', 28a'', 28a''', . . . appears in associated time intervals $e_2$, $e_3$, $e_4$, . . . , followed by subsequent 180° non-selective RF signal pulses 22a', 22a'', 22a''', . . . in associated time intervals $f_2$, $f_3$, $f_4$, . . . , and the second phase-encoding pulse lobes 28b', 28b'', 28b''', . . . associated time intervals $g_2$, $g_3$, $g_4$, . . . , before the application of associated read-out $G_X$ field portions 26b', 26b'', 26b''', . . . during which the subsequent spin-echo signals 30a', 30a'', 30a''', . . . are provided by the excited spins in selected slab 10a and are received, digitized and processed along with the initial spin-echo response signal 30a.

In accordance with another principle of the present invention, the imaging sequence having the flow-encoding pulses (e.g. like-polarity pulses 28a and 28b, interspersed with a 180° non-selective inverting RF pulse 22a) is followed by a similar imaging sequence, for the same Y-direction column encoding pulse 24a' amplitude, but without the flow-encoding pulses 28 in the flow-direction axis magnetic field gradient, e.g. $G_Z$. Thus, starting at time $t_0'$, the non-phase-encoding multiple-echo sequence commences, in first time interval $a_1'$, with the $\Delta Z$ slab-selecting gradient lobe signal 28a', in conjunction with a 90° selective RF excitation pulse 22'. In the next time interval $b_1'$, the Z-rehasing lobe 20b' appears with the $G_Y$ phase-encoding signal 24a'(of the same magnitude as the signal lobe 24a used in conjunction with the flow-encoding sequence), and the X-axis dephasing lobe 26a'(of the same magnitude as the signal lobe 26a in the flow-encoding sequence). In the next time interval $c_1'$, the phase-shift-normalizing $G_Z$ lobe signal 20c', analagous to signal 20c in the flow-encoding sequence, is present. As no flow-encoding is utilized in the second sequence, time intervals analagous to intervals $d_1$, $e_1$ and $g_1$ are not utilized. Therefore, the next time interval is $f_1'$, in which the 180° non-selective inverting RF pulse 22b is provided, followed by the first imaging signal response read-out time interval $h_1'$, wherein the $G_X$ read-out gradient portion 26b is applied to cause a first spin-echo imaging response signal 30b to be provided. The same number N of multiple-echoes is provided for the non-flow-encoding sequence as was provided for the flow-encoding sequence.

It will be understood that the entire two-dimensional image, either of the fluid-flow or stationary material, requires that additional flow-encoded/non-flow-encoded sequences be consecutively provided; each pair of sequences (one having the flow-encoding pulses 28a and 28b and the other devoid of the flow-encoding pulses) has one of the required additional values and polarities of the $G_Y$ gradient, as shown by the broken line gradient lobes for signal portions 24a and 24a'', to complete imaging over the slab 10a.

It should also be understood that the use of the flow-encoding sequence of FIG. 2b, i.e. having a pair of identical-duration, identical-amplitude and opposite-polarity lobes 16a and 16b with no 180° RF pulse therebetween, can be utilized. In that case, the 180° non-selective RF inverting pulse signal is provided, as shown in broken line, as signals 22c, 22c', 22c'', 22c''', . . . in associated time intervals $d_1$, $d_2$, $d_3$, $d_4$, . . . and the signals 22a, 22a', 22a'', 22a''', . . . are not utilized. This alternating of opposite-polarity flow-encoding pulses, following a non-selective 180° RF inverting pulse, is also shown in FIGS. 3a' and 3d'.

The use of alternating polarity for the opposite-polarity flow-encoding pulse pairs also allows solution of an additional problem inherent in the phase-contrast approach. That is, the problem of the phase $\phi$, or the phase difference $\Delta\phi$, being a periodic function uniquely defined only over the range $-\pi$ to $+\pi$. That is, if the flow velocity in a particular pixel creates a phase advance greater than $+\pi$, or a phase retardation greater than $-\pi$, then the reconstruction algorithm for flow imaging will compute the wrong value for the flow velocity, as these conditions represent the classic aliasing problem for a periodic function. The aliasing problem can be overcome by using the magnitude and duration of the flow-encoding pulses to satisfy the Nyquist criterion, i.e. choosing the gradient such that the maximum expected fluid flow velocity generates no more than a $\pm\pi$ radian phase shift. This maximum flow velocity must be chosen relatively conservatively to insure that all flow velocities are faithfully reproduced. Therefore, many of the velocities of interest will be less than the maximum flow velocity and will accordingly produce relatively small phase changes, which are difficult to measure due to the random phase component superimposed on the actual phase shift, by the random noise in the imaging system. It will be seen that the maximum measurable flow velocity is set by the Nyquist criterion while the minimum measurable flow velocity, as well as velocity resolution, is determined by the system signal-to-noise ratio. In many applications, such as measurement of flow velocity with high spatial resolution, the restrictions imposed may provide a dynamic flow velocity range which is inadequate for full use. The dynamic range and velocity resolution can be increased in flow measurements without a significant imaging time penalty, by utilizing the multi-echo imaging sequence with a pair of sequential flow-encoding pulses having alternating initial polarity, to allow a plurality of echoes to be summed to increase the signal-to-noise ratio and therefore the velocity resolution. In this case, the phase contrast image generated for each echo is given by $$\Delta\phi_n(X,Y,Z) = (-1)^{n-1} \ln(\gamma G_Z V_Z(X,Y,Z)\tau^2) \qquad (9)$$

where n is the echo index, i.e. n = 1, 2, 3, . . . , N for the plurality N of echoes obtained for each pixel at location (X,Y,Z). The flow image generated by the sequence is reconstructed by first plotting the phase, after correction for the sign reversal (that is, by multiplying each phase shift $\Delta\phi_n(X,Y,Z)$ by $((-1)^{n-1})$, as a function of echo number N. For velocities near the Nyquist rate, the cumulative phase may be aliased on certain echoes although, because there is no aliasing on a single echo, the phase difference can be unwrapped as a function of echo number for all velocities satisfying the Nyquist criterion. Following the phase unwrapping step, the phase difference can be fitted to a straight line curve as a function of echo number, with the slope of the fitted curve representing the average phase rotation per echo and related to the flow velocity by $$X_Z(X,Y,Z) = \dot{\phi}(X,Y,Z)/(\gamma G \tau^2) \qquad (10)$$

where $\dot{\phi}(X,Y,Z)$ is the slope. This processing acts to increase the dynamic range by reducing the effect of noise and, in particular, if all of the plurality N of echoes are recorded in a time less than the spin-spin relaxation time $T_2$ of the flowing fluid, e.g. blood, then the dynamic range is increased approximately by the square root of the number of echoes, i.e. by $\sqrt{N}$. Since the spin-spin relaxation time $T_2$ of blood is greater than about 200 milliseconds, 4–6 echoes can be recorded in a time sufficiently less than the relaxation time $T_2$ of the flowing blood and therefore the multiple-echo method can easily increase both the dynamic range and the velocity resolution of the phase-contrast image by a factor of between about 2 and about 2.5.

It should be further understood that three-dimensional (3-D) flow images can be obtained by utilizing phase-encoding on the Z axis, as shown by the variable-amplitude, negative-polarity rephasing lobes 20b-1 and 20b-2 for the $G_Z$ waveforms of FIG. 3a'; by Hadamard encoding of the selective excitation; and by other known methods. If Z-axis phase-encoding is utilized, the phase-shift-normalizing $G_Z$ gradient lobes 20c and 20c' are generally not required; only the slab selection pulses 20a and 20a' and the Z-axis phase-encoding pulses 20b-1 or 20b-2 are provided in the Z-axis gradient, prior to the flow-encoding pulses 28, themselves applied prior to the read-out gradient 26b, e.g. along the X axis, for each echo.

It should be further understood that the non-selective 180° inverting RF pulses 22a, 22a', 22a'', 22a''', . . . or 22c, 22c', 22c'', 22c''', . . . may not contribute exactly the 180° phase shift required to invert the flowing spins, and a four-part sequence, such as the "chopper" sequence of the aforementioned U.S. Pat. No. 4,443,760, may be required. That is, the selective 90° RF pulses 22 and 22' may have to be phase alternated for subsequent pairs of flow-encoded/non-flow-encoded sequences and alternating sequence pairs of the imaging NMR signals may have to be subtracted to allow the desired signals, due to the 90° RF pulses, to reinforce while the undesired signals produced by the imperfect 180° pulses are cancelled. This technique basically requires that the 90° RF pulses 22 and 22' of FIG. 3d be utilized respectively with flow-encoding pulses 28 in a flow-encoded first sequence followed by a non-flow-encoded second sequence devoid of pulses 28, and that the oppositely, or reverse-phased, 90° RF selective pulses 22r and 22r' (as shown in FIG. 3d') be sequentially utilized respectively with a flow-encoded third sequence (having flow-encoding pulses 28) and a subsequent non-flow-encoded fourth sequence (devoid of flow-encoding pulses 28). Similarly, it is within the scope of the present method to utilize a four-part pulse sequencing method in which a first multi-echo sequence has the 90° selective pulse with a positive phase, in the presence of pulse-encoding pulses 28, followed by a second multi-echo sequence with the 90° selective RF pulse having a negative phase and with the flow-encoding pulses 28 present, and then followed by third and fourth multi-echo sequences, each devoid of flow-encoding pulses 28, and respectively having the positive-phased and negative-phased 90° selective RF pulses, respectively. Again, the pair of multiple-echo signals responsive to the oppositely-phased selective RF signals for each flow-encoding value would be subtracted from one another and two images would be formed for each like-positioned echo of the sequence. The amplitude image and the phase-contrast image for each echo position can be computed according to the formulae:

$$A(X,Y) = (A_1^2 + B_1^2)^{\frac{1}{2}} + (A_2^2 + B_2^2)^{1/2} \quad (11)$$

for the amplitude image and $$\Delta(X,Y) = \tan^{-1}((B_1A_2 - B_2A_1)/(A_1A_2 + B_1B_2)) \quad (12)$$

for the phase-contrast image, where $A_1$ and $B_1$ are respectively the real part and the imaginary part, respectively, of the image at a two-dimensional point (X,Y) with flow-encoding pulses 28 present; and $A_2$ and $B_2$ are respectively the real part and the imaginary part, respectively, of the image at the same point (X,Y) with flow-encoding pulses 28 not present in the imaging sequence. Again, as the sign of both the spatial encoding and the flow-encoding phases alternate from echo to echo in a sequence, the reconstruction program will invert the Y-direction-encoding sequence prior to Fourier transformation and will invert the sign of the final phase contrast image for alternate echoes. I have found that a four-echo sequence, designed to faithful produce flow velocities up to about 100 cm/sec. can also accurately detect (resolve) a flow velocity as small as 1 cm/sec. with a system white noise phase-jitter of about 4° per pixel.

Figure 4A:
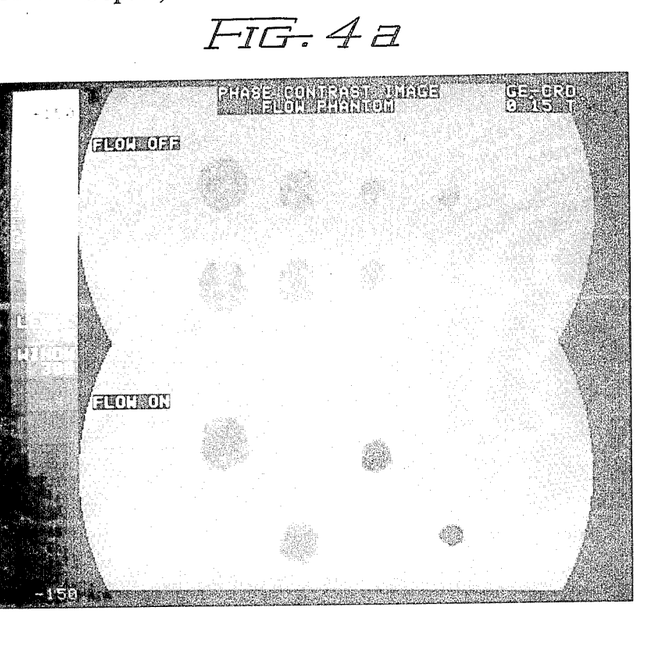
FIG. 4a is a photograph illustrating the images obtained for a multiple-velocity flow phantom for both the "flow off" and "flow on" situations, and useful in an appreciation of the principles of the present invention.

Referring now to FIG. 4a, a photograph of the phase-contrast images taken of a flow phantom, without and with a liquid flow occurring, is shown. The flow phantom consists of eight tubes of four different sizes, arranged with decreasing diameter in each column from left to right, from about 16 millimeters in diameter at the left to about 6 millimeters in diameter at the right, with each diameter tubing being provided as a pair of tubes arranged one above another in each of two rows. The tubes are connected in series and the flow through the phantom is controlled such that for each tube diameter there is forward flow in one tube and reverse flow in the other tube of that column (and of the same diameter). The length of each of the eight tubes is made sufficiently long to insure nearly laminar, i.e. non-turbulent, flow under substantially all conditions. Continuous flow of the liquid through the phantom is maintained with a mechanical pump. As the tubes are connected in series and non-turbulent flow is present, the average flow velocity in each tube varies substantially only as the inverse of the cross-sectional area of the tube. The flow phantom apparatus was positioned within the bore of a 0.15 Tesla (T) imaging system magnet, with the direction of flow within the phantom being either parallel or anti-parallel to the direction of the main magnetic field, i.e. along the Z axis. The phantom was imaged using a two-dimensional, partial saturation, multi-echo, phase-contrast sequence in which a pair (i.e. N=2) of echoes was obtained.

With the flow pump turned off, the image at the top of the FIG. 4a photograph illustrates that the two-echo average provide grey-scale data, which was adjusted to define zero flow to correspond to a zero value and an intermediate grey-level, which is substantially identical for all eight tubes of the phantom. However, as shown by the grey-scale values of the eight flow phantom tubes in the lower portion of FIG. 4a, when the flow pump is turned on and set for a flow rate of about 400 cc/min., the images obtained by use of a flow-encoding-on/flow-encoding-off sequence clearly shows both the grey-level change with changing velocity and with changing direction. In particular, the grey scale in this bottom picture is defined such that zero flow corresponds to a value of zero and an intermediate grey level, with flow into the plane of the image being represented by a value greater than zero and a grey level brighter than the median grey, and with flow out of the plane of the image being represented by a value less than zero and a grey scale darker than the median grey. Thus, in the largest diameter tubes, in the left-hand-most column, the lowest fluid flow velocities are obtained, with the fluid in the top tube of the pair flowing out of the picture (toward the viewer) and the fluid in the bottom tube of the pair flowing into the plane of the picture (away from the viewer). It will be seen that the slowest flow phantom tubes have grey-scale values respectively slightly darker and slightly brighter than the flow-off phantoms. In the second-largest pair of tubes, in the column immediately to the left of the center of the photograph, the top tube contains fluid flowing into the plane of the image, while the bottom tube contains fluid flowing out from the plane of the image; it will be seen that the brighter top tube image and darker bottom tube image have values respectively more bright, and more dark, than the respective bottom and top tubes of the largest diameter phantoms. Similarly, the third-largest tubes, being the pair of tubes immediately to the right of the photograph vertical center line, have a flow into the plane of the image in the bottom tube and out from the plane of the image in the top tube; the grey-scale levels are substantially proportionally brighter and darker, respectively, than the "into" and "out from" grey-scale levels of the larger diameter tube pairs. Finally, it will be seen that the right-hand-most pair of tubes, having the smallest diameter, have a flow magnitude greater than the flow magnitude of any of the other tube pairs, with the top tube having a flow into the plane of the image and the bottom tube having a flow out of the plane of the image; the brighter and darker grey-scale images are again substantially proportional to the flow magnitude.

Figure 4B:
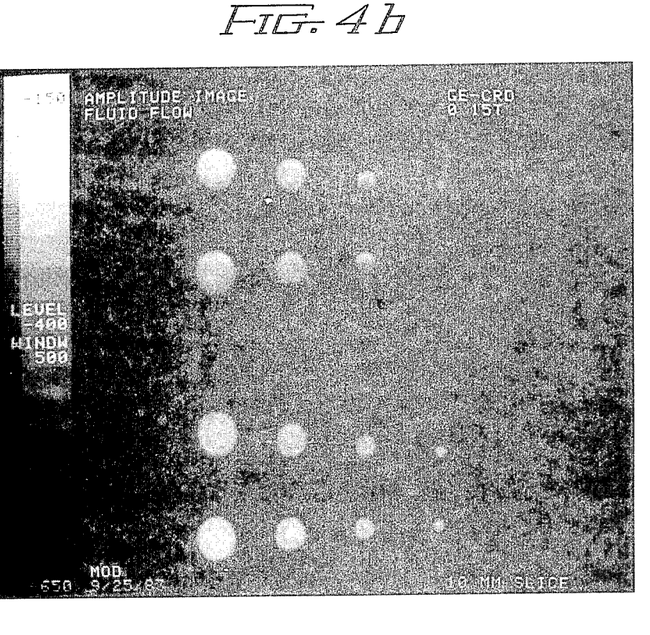
FIG. 4b is a photograph illustrating the amplitude-only image of the flow phantom of FIG. 4a, both in the absence and presence of fluid flow.
Figure 4C:
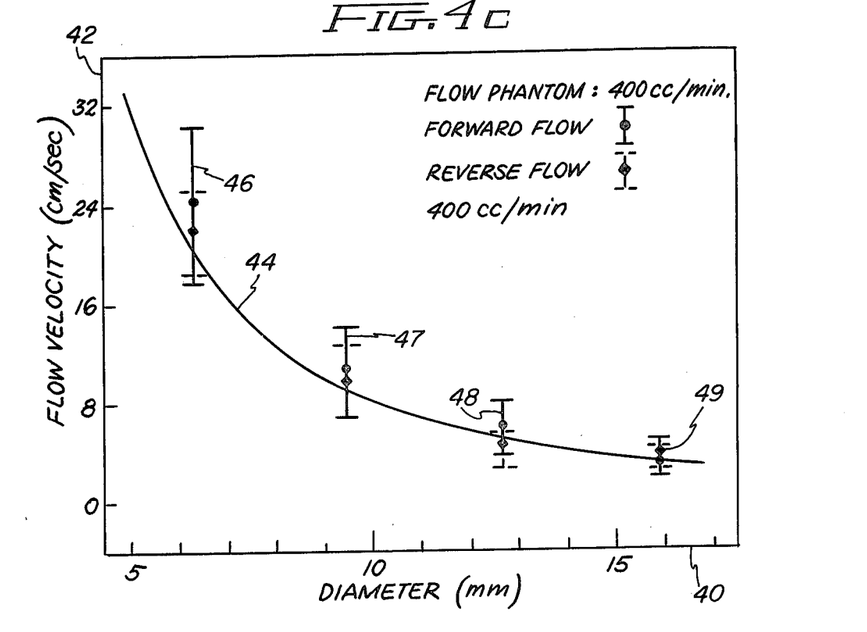
FIG. 4c is a graph correlating the measured flow velocity in the flow phantom in comparison to expected flow velocity for both forward and reverse flows.

FIG. 4c graphically illustrates the flow distribution within the tubes, where the abscissa 40 is scaled in the diameter, in millimeters, of the four tubes (of about 6.2 millimeters, about 9 millimeters, about 12.8 millimeters and about 15.9 millimeters, respectively) and the ordinate 42 is scaled in units of flow velocity in cm/sec. Curve 44 is the computed average flow velocity expected as a function of the tube diameter, assuming laminar flow for a volume flow rate of 400 cc/min. As the tubes are connected in series, the average velocity should vary as the inverse square of the tube diameter for non-turbulent flow and the standard deviations should scale proportional with the average velocity for near-laminar flow. The measured mean velocity and standard deviations for both forward flow (represented by circular indicators) and reverse flow (represented by diamond indicators) clearly indicates that the measured mean velocity very closely parallels predicted results for both flow directions and that the average deviation does indeed scale with mean velocity flow as predicted.

FIG. 4b is another photograph illustrating the amplitude image in both the fluid flow and non-fluid flow conditions, similar to those of FIG. 4a. In both cases, at the top and bottom portions of the photograph of FIG. 4b, the same two-echo sequence, used for the images of FIG. 4a, was utilized. However, in FIG. 4b, the images were obtained by simply averaging the image information from both echoes, i.e. the image intensity A is given by $A(X,Y)=(A_1(X,Y)+A_2(X,Y))/2$. The phase information was discarded. It will be seen that the grey scale, having been set for an intermediate (zero) value and grey level, is approximately the same for each of the eight tubes, whether the flow pump is off (top photograph portion) or the flow pump is on (bottom photograph portion) and the only information imaged is the presence and diameter of the flow phantom tubing. Thus, it will be seen that spin-spin lattice $T_2$ images, as well as more conventional amplitude images, can also be generated from the flow-encoded data.

Figure 5:
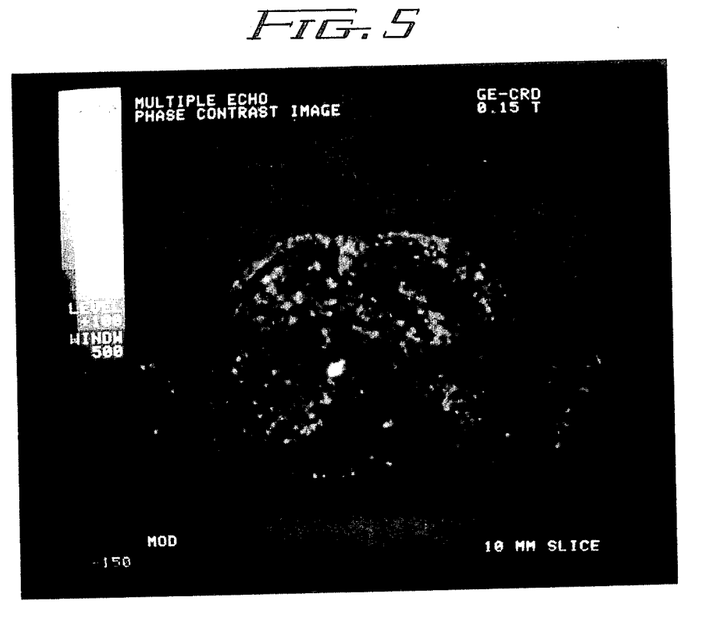
FIG. 5 is a phase-contrast image of the abdominal region of a human volunteer subject, illustrating the direction and magnitude of blood flow obtained by the novel flow-encoded, multiple-echo NMR imaging method of the present invention.

Referring to FIG. 5, a multiple-echo, phase-contrast image of a healthy adult volunteer is shown. The image was obtained with a simple two-dimensional, two-echo sequence and is an axial slice in the abdomenal region. While the volunteer subject's right-hand side is at the left-hand side of this phase-contrast image, it will be seen that blood flow in the inferior vena cava is correctly depicted, as a lighter grey-scale area slightly to the left of center, as flowing into the plane of the image, while the blood in the abdominal aorta is correctly depicted, in the darker grey-scale portion slightly to the right of the vertical midline of the picture, as flowing out of the plane of the image. This image was also obtained at 0.15 T, with a slice thickness $\Delta Z$ of about 1 centimeter and with each pixel having a dimension of 3.5 millimeter-squared, with data acquisition requiring only 1.5 minutes. The grey-scale information in the abdomenal aorta and inferior vena cava areas, when referenced to the stationary portion grey-scale level, indicates that the average value of blood flow velocity in the vena cava is 10.5 cm/sec. ±5.4 cm/sec. (for a peak velocity of about 19.6 cm/sec.), a value well within the normal range for a healthy adult at this level of the abdomen. In contrast, the average value of the velocity in the abdominal aorta is only −8.1 cm/sec.±2.4 cm/sec. (peak velocity equal to about −12.4 cm/sec.), a value smaller than the expected average in a healthy adult. It appears that this understatement of the aorta flow velocity is related to the pulsatile nature of flow in the major arteries. That is, during the interval of each cardiac cycle when peak flow is present in the aorta, the phase was aliased for the flow-encoding pulse used in this particular experiment. The amplitude of the flow-encoding pulse was chosen to produce substantial phase shifts for the average flow velocities in the vena cava and the aorta and, indeed, during the interval of low flow the phase was in fact faithfully measured by the imaging experiment. However, because the measurements were not synchronized with the cardiac cycle, the aliased measurements averaged with the non-aliased measurements to result in an underestimation of the true phase change associated with aortic flow. This problem can be completely circumvented by insuring that the flow-direction magnetic field gradient, e.g. the Z-axis field gradient $G_Z$, is chosen such that peak flow in the major arteries is not aliased. Nevertheless, the result, graphically illustrated in FIG. 5, clearly demonstrates the operation and utility of my multiple-echo, phase-contrast method of magnetic resonance blood flow imaging.

While many variations and modification will now occur to those skilled in the art, it is my intent to be limited only by the scope of the appending claims and not by the few illustrated pulse sequences and other details presented by way of explanation of the principles of the inventive method herein.

What I claim is:

1. A method for magnetic resonance imaging of fluid flow in a sample, comprising the steps of:

(a) immersing the sample in a static magnetic field disposed in a first direction;

(b) applying a first sequence of magnetic field gradients and radio-frequency signals to the sample to both define a slab, of the sample to be imaged, in a plane substantially orthogonal to a selected direction for which flow velocity is to be measured, and to obtain a plurality N of spin-echo response signals from that slab;

(c) processing the plurality of first sequence spin-echo signals to obtain a complex value $A_1(X,Y,Z)$ relating both the spin density $\rho'(X,Y,Z)$, ... and the phase rotation $\phi(X,Y,Z)$, induced by the first sequence, for each of a selected number of sequential locations $(X,Y,Z)$ in the sample slab;

(d) applying a second sequence of magnetic field gradient and radio-frequency signals to both define the same sample slab as in step (b) and to obtain another plurality N of spin-echo response signals from that slab;

(e) including a waveform in at least one of the magnetic field gradient and radio-frequency signals applied in step (d) for imparting to each of the spin-echo signal components from each slab location having a flowing material therein a phase rotation dependent upon the magnitude of the flow velocity therein in the selected direction;

(f) processing the plurality of second sequence spin-echo signals to obtain a complex value $A_2(X,Y,Z)$ relating the spin density $\rho'(X,Y,Z)$ and the imparted phase rotation of the sample material along the selected flow measurement direction for each of the sequential locations $(X,Y,Z)$ in the sample slab; and (g) processing the complex values $A_1(X,Y,Z)$ and $A_2(X,Y,Z)$ for each sample location to obtain a differential phase-contrast value related to the velocity of the flowing material therein in the selected measurement direction.

2. The method of claim 1, further including the step of: displaying each of a plurality of pixels, each corresponding to a different location in the sample slab, with differential value related to the differential phase contrast value of that location, to provide an image in which the stationary and flowing portions of the selected slab are discernible both as to location and to flow magnitude thereat.

3. The method of claim 1, wherein step (e) includes the step of: providing at least one of the magnetic field gradients with a phase-encoding waveform having a zero mean value over a finite time interval.

4. The method of claim 3, wherein the step of providing the phase-encoding waveform includes the step of: providing a pair of pulses in the at least one magnetic field gradient, with the pair of pulses having a substantially zero mean value over a finite time interval.

5. The method of claim 4, further comprising the step of: preceding each spin-echo response signal by a pair of the magnetic field gradient phase-encoding pulses.

6. The method of claim 5, further comprising the step of: substantially commencing each of said first and second sequences with a gradient field and a 90° selective radio-frequency pulse signal to select the sample slab.

7. The method of claim 4, further comprising the step of: providing each of the pair of phase-encoding pulses with substantially the same amplitude and time duration.

8. The method of claim 7, further comprising the steps of: providing each pulse of each phase-encoding pulse pair with the same polarity; and providing a nonselective substantially 180° radio-frequency signal between each of the pulses of each phase-encoding pulse pair.

9. The method of claim 7, further comprising the steps of: providing each pair of phase-encoding pulses with first and second pulses of opposite polarity; and preventing the appearance of a radio-frequency signal during the interval from the beginning of the first pulse to the cessation of the second pulse of each phase-encoding pulse pair.

10. The method of claim 9, further comprising the step of: reversing the polarity sequence of each phase-encoding pulse pair for each consecutive pair of phase-encoding pulses in the second sequence.

11. The method of claim 7, further comprising the step of: selecting the phase-encoding pulses to provide a phase-rotation of not greater than $\pm\pi$ radians for the largest flow velocity encountered in the sample slab.

12. The method of claim 1, further including the step of: providing, in each of the first and second signal sequences, a magnetic gradient signal, along the axis in which flow is to be imaged, selected to impart, in the first sequence of step (b), to both flowing and stationary nuclei the same amount of normalized phase shift.

13. The method of claim 1, further comprising the step of: completing steps (d)–(f) prior to completing steps (b) and (c).

14. The method of claim 1, further comprising the step of: selecting the direction of flow velocity measurement to substantially coincide with the first direction.

15. The method of claim 1, further comprising the step of: repeating all of steps (a)–(g) for at least one other combination of magnetic field gradients selected to obtain differential phase-contrast values for fluid flow in another selected measurement direction.

16. The method of claim 15, further comprising the step of: selecting the at least one other direction to be substantially orthogonal to the first direction.

17. The method of claim 1, further comprising the steps of:

(g) applying the first and second sequences of steps (b) and (d) with a substantially-90° selective radio-frequency signal of a first phase in an initial slab-selection portion of each of the first and second sequences, prior to the portions thereof providing the plurality of spin-echo response signals;

(h) applying a third sequence of magnetic field gradients and radio-frequency signals to the sample, the third sequence being duplicative of the first sequence, but having the substantially-90° selective radio-frequency signal provided with a second phase substantially opposite to the first phase;

(i) applying a fourth sequence of magnetic field gradient and radio-frequency signals, the fourth sequence being duplicative of the second sequence, but having the substantially-90° selective radio-frequency signal provided with the second phase; and (j) processing the complex values obtained from the response echoes to the first through fourth sequences, to obtain differential phase-contrast values having a nominal mean value for stationary material of the slab and having values respectively greater than and less than the mean value for fluid flowing in a selected one direction and in the opposite direction, respectively, through the selected slab.

18. The method of claim 17, further including the step of: displaying each of a plurality of pixels, each corresponding to a different location in the sample slab, with differential value related to the differential phase contrast value of that location, to provide an image in which the stationary and flowing portions of the selected slab are discernible as to location, flow magnitude and flow direction thereat.

19. The method of claim 18, further comprising the step of: displaying those pixels corresponding to fluid flowing respectively parallel and anti-parallel to the selected direction with grey-scale values respectively lighter and darker than a grey-scale value assigned to the mean value for stationary material.

20. The method of claim 17, further comprising the step of: repeating all of steps (a)–(i) for at least one other combination of magnetic field gradient selected to obtain differential phase-contrast values for fluid flow in another selected direction.

21. The method of claim 20, further comprising the step of: selecting the at least one other direction to be substantially orthogonal to the first direction.

* * * * *